(12) United States Patent
Shea et al.

(10) Patent No.: US 10,707,327 B2
(45) Date of Patent: Jul. 7, 2020

(54) MOSFET WITH REDUCED RESISTANCE

(71) Applicant: Great Wall Semiconductor Corporation, Tempe, AZ (US)

(72) Inventors: Patrick M. Shea, Oviedo, FL (US); David N. Okada, Chandler, AZ (US); Samuel J. Anderson, Tempe, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 593 days.

(21) Appl. No.: 14/981,483

(22) Filed: Dec. 28, 2015

(65) Prior Publication Data

US 2016/0308015 A1  Oct. 20, 2016

Related U.S. Application Data (60) Provisional application No. 62/150,214, filed on Apr. 20, 2015.

(51) Int. Cl.
*H01L 27/118* (2006.01)
*H01L 29/66* (2006.01)
(Continued)

(52) U.S. Cl.
CPC ........ *H01L 29/6659* (2013.01); *H01L 23/485* (2013.01); *H01L 29/7833* (2013.01); *H01L 21/561* (2013.01); *H01L 23/3107* (2013.01); *H01L 23/49541* (2013.01); *H01L 23/49562* (2013.01); *H01L 23/49582* (2013.01); *H01L 24/02* (2013.01); *H01L 24/11* (2013.01); *H01L 24/13* (2013.01); *H01L 24/16* (2013.01); *H01L 24/29* (2013.01); *H01L 24/48* (2013.01); *H01L 24/81* (2013.01); *H01L 24/97* (2013.01); *H01L 29/1087* (2013.01); *H01L 29/41758* (2013.01);

*H01L 29/41766* (2013.01); *H01L 29/665* (2013.01); *H01L 2224/024* (2013.01); *H01L 2224/0239* (2013.01);
(Continued)

(58) Field of Classification Search
CPC ... H01L 2924/00014; H01L 2224/0239; H01L 2224/13111; H01L 2924/014; H01L 2924/01047; H01L 2924/01029; H01L 2224/131; H01L 2224/1134; H01L 2224/1145; H01L 2224/11452; H01L 2224/11462

See application file for complete search history.

(56) References Cited

U.S. PATENT DOCUMENTS

| 2003/0203563 | A1* | 10/2003 | Kim | H01L 27/11 438/233 |
| 2012/0309143 | A1* | 12/2012 | Takao | G11C 11/412 438/199 |

OTHER PUBLICATIONS

P.C. Chao et al., "0.2 Micron Length Mushroom Gate Fabrication Using a New Single-Level Photoresist Technique", IEDM 82-415, pp. 1-4, IEEE 1982.

(Continued)

*Primary Examiner* — Meiya Li
(74) *Attorney, Agent, or Firm* — Foley & Lardner LLP (57) ABSTRACT

A semiconductor device includes a semiconductor substrate including a doped region. A metal layer is formed on the doped region. An insulating layer covers the metal layer. The metal layer can serve as a buried metal layer which reduces electrical resistance between electrical charge in the doped region and adjacent contacts. The contacts can extend through the insulating layer between the buried metal layer and overlying metal stripes.

16 Claims, 6 Drawing Sheets

(51) Int. Cl.
- *H01L 23/485* (2006.01)
- *H01L 29/78* (2006.01)
- *H01L 23/00* (2006.01)
- *H01L 29/417* (2006.01)
- *H01L 23/495* (2006.01)
- *H01L 21/56* (2006.01)
- *H01L 29/10* (2006.01)
- *H01L 23/31* (2006.01)

(52) U.S. Cl.
CPC ............... *H01L 2224/02311* (2013.01); *H01L 2224/0401* (2013.01); *H01L 2224/05548* (2013.01); *H01L 2224/1134* (2013.01); *H01L 2224/1145* (2013.01); *H01L 2224/1147* (2013.01); *H01L 2224/11452* (2013.01); *H01L 2224/11462* (2013.01); *H01L 2224/11464* (2013.01); *H01L 2224/131* (2013.01); *H01L 2224/133* (2013.01); *H01L 2224/13013* (2013.01); *H01L 2224/13014* (2013.01); *H01L 2224/13024* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/13184* (2013.01); *H01L 2224/13294* (2013.01); *H01L 2224/16245* (2013.01); *H01L 2224/291* (2013.01); *H01L 2224/293* (2013.01); *H01L 2224/29294* (2013.01); *H01L 2224/814* (2013.01); *H01L 2224/816* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81466* (2013.01); *H01L 2224/81484* (2013.01); *H01L 2224/81594* (2013.01); *H01L 2224/81815* (2013.01); *H01L 2224/97* (2013.01); *H01L 2924/00014* (2013.01); *H01L 2924/13091* (2013.01); *H01L 2924/181* (2013.01)

(56) References Cited

OTHER PUBLICATIONS

P.C. Chao et al., "A Submicron Gate-Wall Structure for Low-Noise Mesfet's", 92—IEDM 81, pp. 1-7, IEEE 1981.

Z.J. Shen et al., "Breaking the Scaling Barrier of Large Area Lateral Power Devices: An 1mΩ Flip-Chip Power MOSFET with Ultra Low Gate Charge", Proceedings of 2004 International Symposium on Power Semiconductor Devices & ICs, Kitakyushu, pp. 387-390.

Masami Tokumitsu et al., "High-Performance Short-Channel MESFET's with WSiN Gate Suppressing As-Outdiffusion (Saint-Gen. II)", IEEE Transactions on Electron Devices, vol. 35, No. 12, Dec. 1998.

* cited by examiner

MOSFET WITH REDUCED RESISTANCE

CLAIM OF DOMESTIC PRIORITY

The present application claims the benefit of U.S. Provisional Application No. 62/150,214, filed Apr. 20, 2015, which application is incorporated herein by reference.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal-oxide-semiconductor field-effect transistor (MOSFET). Integrated semiconductor devices commonly contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. In particular, power MOSFETs are commonly used in electronic circuits, such as communication systems and power supplies, as electric switches to enable and disable the conduction of relatively large currents in, e.g., DC-to-DC voltage converters, power supplies, and motor controllers.

A power MOSFET device includes a large number of MOSFET cells or individual transistors that are connected in parallel and distributed across a surface of a semiconductor die. Power MOSFET devices are typically used as electronic switches to control power flow to a circuit. A control signal at a gate terminal of the power MOSFET controls whether current flows through the MOSFET between a drain terminal and source terminal of the MOSFET. The conduction path between the drain terminal and source terminal of a MOSFET is wired in series with a circuit to be switched, so that when the MOSFET is off, i.e., the MOSFET limits electric current between the source and drain terminals, current is limited through the switched circuit. When the MOSFET is on, electric current flows through both the MOSFET and the switched circuit, in series, to power the switched circuit.

One consideration in the design and manufacture of a power MOSFET is the electrical resistances between doped regions in a MOSFET and the external package contacts presented to an engineer designing a circuit including the power MOSFET. Reducing electrical resistance in metal layers formed on a MOSFET, as well as redistribution layers (RDL) and leadframe of the MOSFET package, reduces the amount of wasted power dissipated into the MOSFET during use.

SUMMARY

Accordingly, in one embodiment, the present invention is a method of making a semiconductor device comprising providing a semiconductor substrate including a doped region, forming a metal layer on the doped region, depositing an insulating layer over the metal layer, and forming an electric contact through the insulating layer.

In another embodiment, the present invention is a semiconductor device comprising a semiconductor substrate including a doped region. A metal layer is formed on the doped region. An insulating layer is formed over the metal layer. An electric contact is formed through the insulating layer.

In another embodiment, the present invention is a semiconductor device comprising a semiconductor substrate including a doped region. A metal layer is formed on the doped region. An insulating layer covers the metal layer.

DETAILED DESCRIPTION OF THE DRAWINGS

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

A region of semiconductor material can be negatively doped or positively doped. Negatively doped, or N-doped, regions are doped with a negative, or N-type, dopant, such as phosphorus, antimony, or arsenic. Each molecule of an N-type dopant contributes an additional negative charge carrier, i.e., an electron, to the semiconductor material. Positively doped, or P-doped, regions are doped with a positive, or P-type, dopant such as boron, aluminum, or gallium. Each molecule of P-type dopant contributes an additional positive charge carrier, i.e., an electron hole, to the semiconductor material. A region of one doping type can be made into a region of the other doping type by adding dopant of the second type in excess of the existing doping concentration. N-type and P-type regions are oppositely doped.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribe lines. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is integrated into the system.

Figure 1:
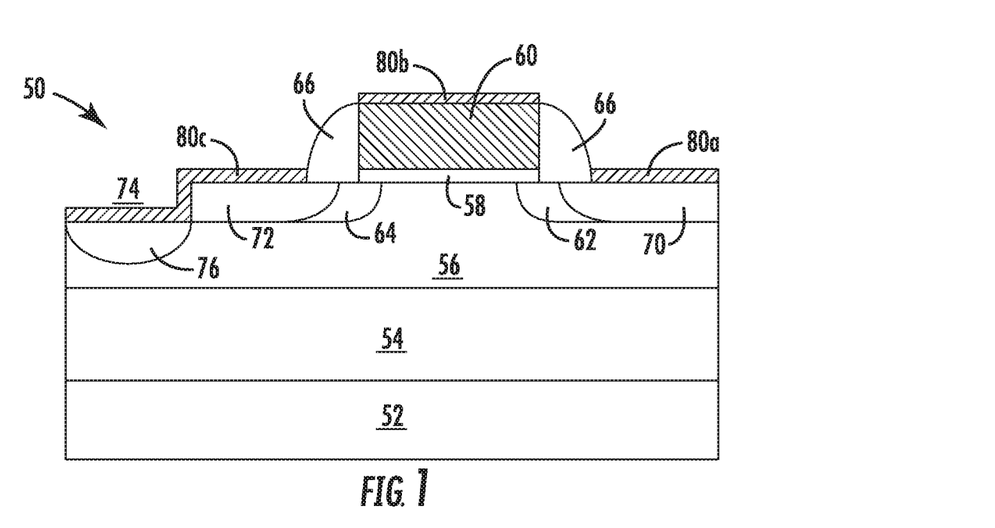
FIG. 1 illustrates a lateral NMOS MOSFET.

FIG. 1 shows a cross-sectional view of a MOSFET cell 50. While an N-channel MOSFET is illustrated, a P-channel MOSFET is formed by switching each doped area to the opposite dopant type. N-channel indicates that the majority carrier of MOSFET cell 50 is negatively charged electrons. P-channel indicates that the majority carrier of MOSFET cell 50 is positively charged electron holes. In other embodiments, MOSFET cell 50 is a lateral double-diffused MOSFET (LDMOS) cell. MOSFET cell 50 is formed in substrate 52. Substrate 52 is formed from a bulk semiconductor material such as silicon, germanium, aluminum phosphide, aluminum arsenide, gallium arsenide, gallium nitride, indium phosphide, silicon carbide, or other similar material. In one embodiment, substrate 52 is a semiconductor wafer with a width or diameter of 200-300 millimeters (mm). In another embodiment, substrate 52 has a width or diameter of 100-450 mm. MOSFET cell 50 is part of a discrete power MOSFET device, but is formed using similar process steps to complementary metal-oxide-semiconductor (CMOS) integrated circuits that include thousands or millions of transistors in a single device. In other embodiments, MOSFET cell 50 is a portion of a MOSFET on the same semiconductor die as other active and passive components.

Substrate 52 is initially doped with a P-type dopant, such as boron, aluminum, or gallium. Dopants are added while growing the semiconductor boule or ingot that substrate 52 is cut from, to provide an approximately uniform initial doping throughout substrate 52. In other embodiments, substrate 52 is positively doped using diffusion, ion implantation, or other suitable processes after being cut from a boule or ingot. Additional P-type dopants are deposited in substrate 52 to form P-wells 54 and 56. In one embodiment, P-well 54 is formed by using a thermal drive to move dopants from P-well 56 deeper into substrate 52. In other embodiments, two separate ion implantations are performed at two different energy levels to form P-wells 54 and 56 at different depths. A thermal anneal process is performed to more evenly spread dopants in P-wells 54 and 56. Implantation of P-wells 54 and 56 is performed as a blanket implantation across substantially the entire wafer of substrate 52.

Gate oxide 58 is formed over substrate 52 and P-wells 54 and 56. Gate oxide 58 contains one or more layers of prepreg, photosensitive low curing temperature dielectric resist, photosensitive composite resist, liquid crystal polymer (LCP), laminate compound film, insulation paste with filler, solder mask resist film, liquid molding compound, granular molding compound, polyimide (PI), benzocyclobutene (BCB), polybenzoxazoles (PBO), hafnium oxide ($HfO_2$), silicon dioxide ($SiO_2$), silicon nitride ($Si_3N_4$), silicon oxynitride (SiON), tantalum pentoxide ($Ta_2O_5$), aluminum oxide ($Al_2O$), solder resist, or other material having similar insulating and structural properties. Gate oxide 58 is deposited using printing, spin coating, spray coating, lamination, or other suitable process.

Gate oxide 58 is initially formed as a blanket layer over substantially the entirety of the wafer of substrate 52. Gate oxide 58 is formed by oxidation of a portion of P-well 56, or by depositing an insulating material over P-well 56. Gate 60 is formed over gate oxide 58 by deposition of undoped polysilicon. Gate 60 is initially formed as a blanket layer extending substantially across the entire width of the wafer of substrate 52. Gate 60 is deposited as undoped polysilicon followed by a blanket implantation of phosphorous or other dopant to improve conduction. A thermal anneal is used to evenly distribute dopant molecules in the polysilicon of gate 60. In one embodiment, the polysilicon of gate 60 is doped prior to deposition.

After gate oxide 58 and gate 60 are blanketed over P-well 56, gate oxide 58 and gate 60 are etched using a photoresist to leave the portions of gate oxide 58 and gate 60 illustrated in FIG. 1. Gate 60 is a stripe extending across MOSFET cell 50 perpendicular to the page. Other appropriate shapes are used for gate 60 in other embodiments.

Lightly N-doped drift (LDD) regions 62 and 64 are formed in P-well 56 using gate 60 as a mask. LDD regions 62 and 64 are lightly doped with an N-type dopant, such as phosphorus, antimony, or arsenic. The light doping of LDD regions 62 and 64 reduces the electric field near gate oxide 58 while still allowing majority carriers to flow. LDD regions 62 and 64 are formed together using a blanket implantation over substantially the entire wafer of substrate 52.

Sidewall spacers 66 are formed flanking both sides of gate 60. In one embodiment, sidewall spacers 66 are formed by conformally depositing a blanket layer of insulating material over MOSFET cell 50, including gate 60. A portion of the deposited insulating material is removed to leave sidewall spacers 66.

N+ drain region 70 and N+ source region 72 are formed using gate 60 and sidewall spacers 66, in combination, as a mask. A blanket implantation of N-type dopant is performed to increase the dopant concentration near the surface of P-well 56 away from gate 60. LDD regions 62 and 64 remain lightly doped near gate 60 because of the additional mask area provided by sidewall spacers 66 relative to when LDD regions 62 and 64 were formed. LDD regions 62 and 64, N+ drain region 70, and N+ source region 72 each extends as a stripe perpendicular to the page and parallel to gate 60.

A trench 74 is formed in a top surface of P-well 56. Trench 74 is formed using a photoresist layer and silicon etchant to remove a portion of semiconductor material from P-well 56. Trench 74 extends as a stripe perpendicular to the page and parallel to gate 60. A photoresist layer is used as a mask to implant P-type dopant through trench 74 and into P-well 56, forming P+ body contact 76. P+ body contact 76 provides good ohmic contact for a source contact of MOSFET cell 50 to P-wells 54 and 56. Creating a coupling between the source contact of MOSFET cell 50 and the body of MOSFET cell 50 reduces the likelihood of latch-up. In some embodiments, a thermal anneal is used after implantation of LDD regions 62 and 64, N+ drain region 70, N+ source region 72, and P+ body contact 76.

Silicide layer 80 is formed over MOSFET cell 50 after the formation of regions 62, 64, 70, 72, and 76 in P-well 56. Silicide layer 80a is formed over N+ drain region 70. Silicide layer 80b is formed over gate 60. Silicide layer 80c is formed over N+ source region 72 and P+ body contact 76. Silicide layer 80 reduces the electrical resistance of the underlying doped regions. In one embodiment, silicide layer 80 is formed as a self-aligned silicide layer, i.e., a salicide layer. Silicide layer 80 is self-aligned by the reaction of a thin metal film with silicon in the doped regions 62, 64, 70, 72, and 76 and gate 60 of MOSFET cell 50. The metal film used to form silicide layer 80 does not significantly react with sidewall spacers 66, so a portion of the film over the sidewall spacers is more easily removed by chemical etching or other suitable means. Removing the metal film over sidewall spacers 66 electrically isolates portions 80a, 80b, and 80c of silicide layer 80 from each other.

MOSFET cell 50 is formed using process steps typical of CMOS logic circuits. MOSFET cell 50 is a single cell formed on substrate 52 adjacent to other MOSFET cells, which are wired in parallel as illustrated below to form a discrete power MOSFET device. Utilizing common CMOS process steps to form a discrete MOSFET device reduces manufacturing cost because CMOS based process technologies are widely available. In some embodiments, 0.13 micron (μm) or 0.18 μm CMOS processes are used.

Figure 2A:
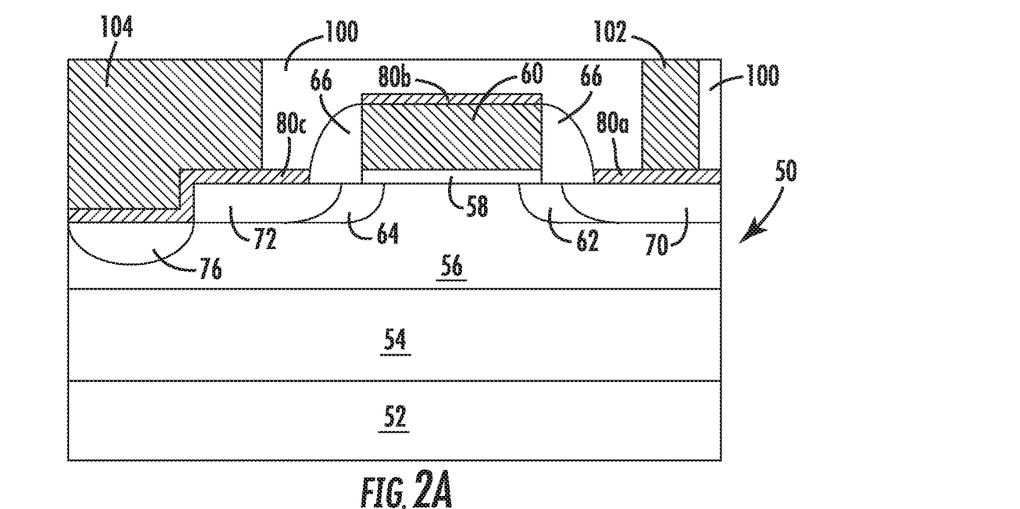
FIGS. 2a-2j illustrate formation of metal layers over the NMOS MOSFET of FIG. 1, including buried metal layers to reduce silicide resistance.

After MOSFET cell 50 is doped as shown in FIG. 1, metallization occurs as illustrated in FIGS. 2a-2j to electrically connect a plurality of MOSFET cells 50 in parallel. In FIG. 2a, buried metal layers 102 and 104 are formed in parallel with silicide layers 80a and 80c to reduce the resistance of electric charge flowing through N+ drain region 70, N+ source region 72, and P+ body contact 76. An interlayer dielectric (ILD) 100 is first deposited over substrate 52. ILD 100 contains one or more layers of prepreg, photosensitive low curing temperature dielectric resist, photosensitive composite resist, LCP, laminate compound film, insulation paste with filler, solder mask resist film, liquid molding compound, granular molding compound, PI, BCB, PBO, HfO2, SiO2, Si3N4, SiON, Ta2O5, Al2O3, solder resist, or other material having similar insulating and structural properties. In one embodiment, ILD 100 contains tetraethyl orthosilicate (TEOS). ILD 100 is an insulating layer deposited using printing, spin coating, spray coating, lamination, or other suitable process.

ILD 100 is planarized using chemical-mechanical polishing (CMP), mechanical planarization, or other suitable methods. In one embodiment, the thickness of ILD 100 after planarization is approximately 9,000 angstroms over N+ drain region 70 and N+ source region 72, and approximately 11,500 angstroms over trench 74 and P+ body contact 76 (1 angstrom=$10^{-10}$ meters or 0.1 nanometer). In another embodiment, a thickness of ILD 100 is approximately 6500 angstroms over N+ drain region 70.

ILD 100 is etched using a photoresist and a chemical etchant, reactive-ion etching, laser direct ablation (LDA), or other suitable etching process at locations where buried metal layers 102 and 104 are to be formed. Remaining portions of the photoresist are removed from over ILD 100 by CMP or other suitable process. In some embodiments, an additional pre-liner or RF pre-cleaning process is used to prepare the trenches for the formation of buried metal layers 102 and 104 followed by deposition of an adhesion layer of titanium (Ti), titanium nitride (TiN), or other suitable material. The adhesion layer is annealed to increase contact adhesion.

The openings through ILD 100 are filled with aluminum (Al), copper (Cu), tin (Sn), nickel (Ni), gold (Au), silver (Ag), Ti, tungsten (W), other suitable electrically conductive material, or a combination thereof using PVD, CVD, electrolytic plating, electroless plating process, or other suitable metal deposition process to form buried metal layers 102 and 104. A CMP or other suitable planarization process is performed after depositing buried metal layers 102 and 104. Buried metal layer 102 is electrically connected to N+ drain region 70 of MOSFET cell 50 through contact with silicide layer 80a. Buried metal layer 104 is electrically connected to N+ source region 72 and N+ body contact 76 of MOSFET cell 50 through contact with silicide layer 80c. Buried metal layers 102 and 104 reduce electrical resistance along the drain and source, respectively, of MOSFET cell 50 by increasing the cross-sectional area of conductive material. Electric charges are able to flow through buried metal layers 102 and 104 in parallel with respective portions of silicide layer 80 and underlying doped regions.

The respective widths of buried metal layers 102 and 104 are selected such that, given the manufacturing tolerances involved, buried metal layers 102 and 104 are unlikely to contact gate 60 even at a maximum expected misalignment. In other embodiments, buried metal layers 102 and 104 completely cover the lateral extent of silicide layers 80a and 80c, respectively.

Figure 2B:
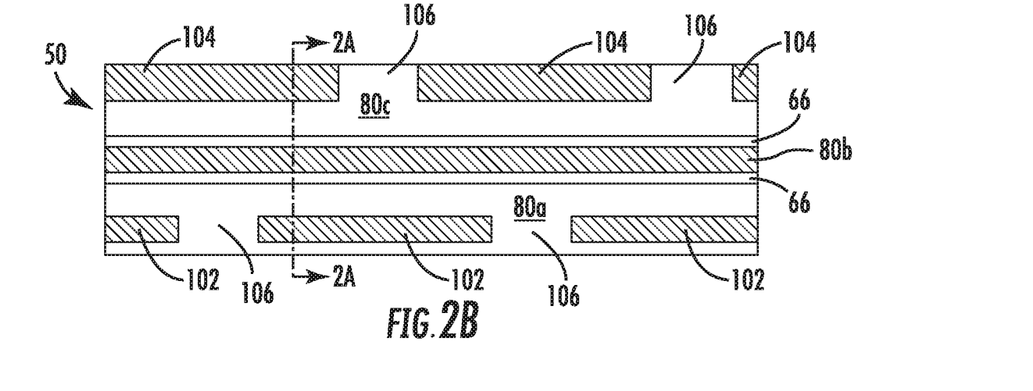

FIG. 2b is a portion of MOSFET cell 50 in plan view after deposition of buried metal layers 102 and 104. ILD 100 is not drawn to better illustrate buried metal layers 102 and 104 relative to the doped regions of MOSFET cell 50. In practice, ILD 100 is not generally removed after forming buried metal layers 102 and 104. Buried metal layers 102 and 104 are formed as a series of line segments extending the length of their respective doped regions. In one embodiment, buried metal layers 102 and 104 include breaks 106 where electrical contacts are subsequently formed. In some embodiments, breaks 106 are approximately 1.10 μm between segments of buried metal layer 102, and breaks 106 are approximately 1.45 μm between segments of buried metal layer 104. Buried metal layers 102 and 104 reduce the resistance for electric charge flowing in N+ drain region 70, N+ source region 72, and P+ body contact 76 between contacts subsequently formed in breaks 106. The arrows labeled 2a in FIG. 2b indicate where the cross section of FIG. 2a is taken. In other cross-sections, taken through breaks 106, one of either buried metal layer 102 or buried metal layer 104 is not visible.

Figure 2C:
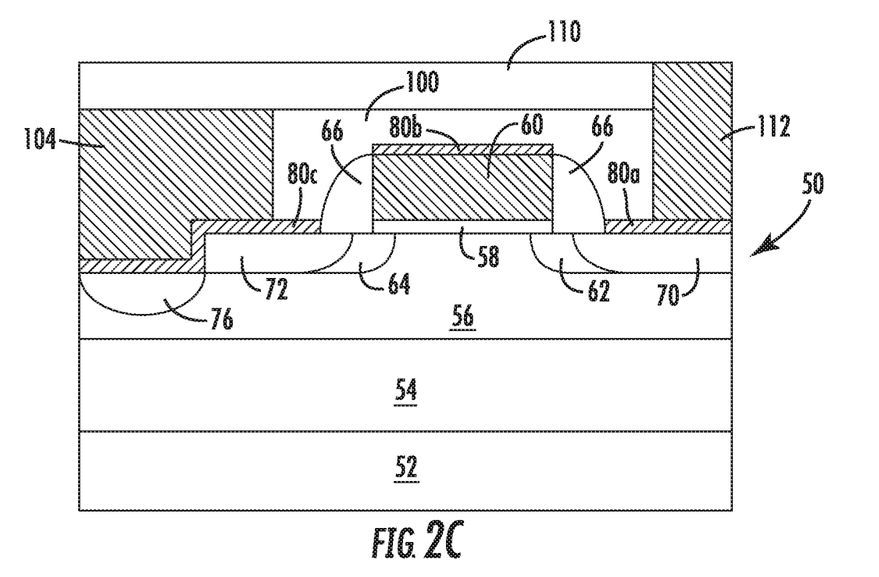

FIG. 2c illustrates ILD 110 deposited over ILD 100 and buried metal layer 104. ILD 110 covers both buried metal layer 102 and buried metal layer 104, but buried metal layer 102 is not visible in the cross-section of FIG. 2c. ILD 110 contains one or more layers of prepreg, photosensitive low curing temperature dielectric resist, photosensitive composite resist, LCP, laminate compound film, insulation paste with filler, solder mask resist film, liquid molding compound, granular molding compound, PI, BCB, PBO, HfO2, SiO2, Si3N4, SiON, Ta2O5, Al2O3, solder resist, or other material having similar insulating and structural properties. In one embodiment, ILD 110 contains TEOS. ILD 110 is an insulating layer deposited using printing, spin coating, spray coating, lamination, or other suitable process.

In one embodiment, a thickness of ILD 110 is approximately 4000 angstroms. In some embodiments, buried metal layers 102 and 104 are contacted on all lateral sides by ILD 100 and on top by ILD 110. In such cases, buried metal layers 102 and 104, including adhesion layers if used, are completely covered in insulating material, and only contact silicide layer 80, ILD 100, and ILD 110. Buried metal layers 102 and 104 are not relied upon to provide vertical interconnection to subsequent metal layers, but rather provide reduction of electrical resistance horizontally across MOSFET cell 50.

A plurality of vias are etched through ILD 110 and ILD 100 at breaks 106 between segments of buried metal layers 102 and 104. The openings through both ILD 100 and 110 are filled with Al, Cu, Sn, Ni, Au, Ag, Ti, W, other suitable electrically conductive material, or a combination thereof using PVD, CVD, electrolytic plating, electroless plating, or other suitable metal deposition process to form drain contacts 112 and source contacts 114 in breaks 106 between segments of buried metal layers 102 and 104. Drain contacts 112 and source contacts 114 are electric contacts. FIG. 2c shows a drain contact 112, but not a source contact 114. Both drain contacts 112 and source contacts 114 are visible in the plan view of FIG. 2d.

Drain contacts 112 extend through ILD 100 and ILD 110 and contact silicide layer 80a to provide electrical connection to N+ drain region 70 of MOSFET cell 50. In one embodiment, adhesion layers are formed from Ti or TiN prior to deposition of tungsten or other metal to form drain contacts 112. Source contacts 114 are formed in breaks 106 of source buried metal layer 104 in a similar manner as drain contacts 112. ILD 110, drain contacts 112, and source contacts 114 are planarized using CMP or another suitable process.

Figure 2D:
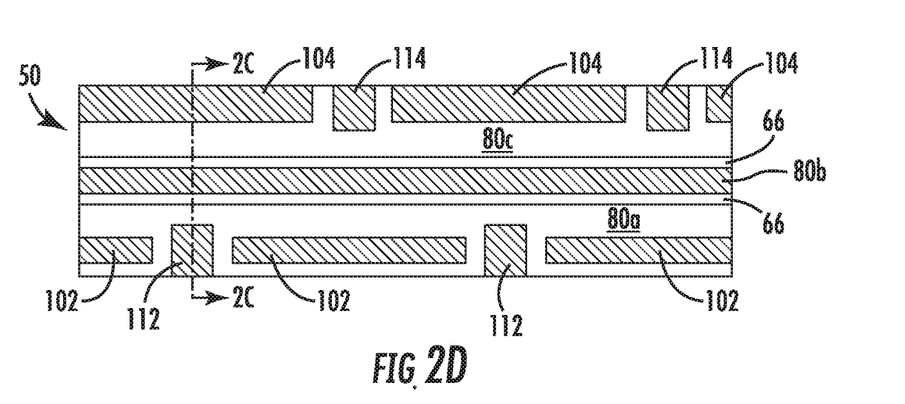

FIG. 2d illustrates a plan view of MOSFET cell 50 without ILD 100 and ILD 110. Drain contacts 112 and source contacts 114 extend higher than buried metal layers 102 and 104 over MOSFET cell 50 to provide electrical connection to subsequently formed metal layers. Buried metal layers 102 and 104 extend laterally to reduce electrical resistances between drain contacts 112 and source contacts 114, respectively. Buried metal layers 102 and 104 are shorter vertically than drain contacts 112 and source contacts 114 so that buried metal layers 102 and 104 do not directly contact overlying metal layers.

The arrows labeled 2c in FIG. 2d show where the cross-section of FIG. 2c is taken from. Drain contact 112 is visible in FIG. 2c because of the location of the cross-section. In other cross-sections, source contact 114 is visible, or neither drain contact 112 nor source contact 114 is visible.

Figure 2E:
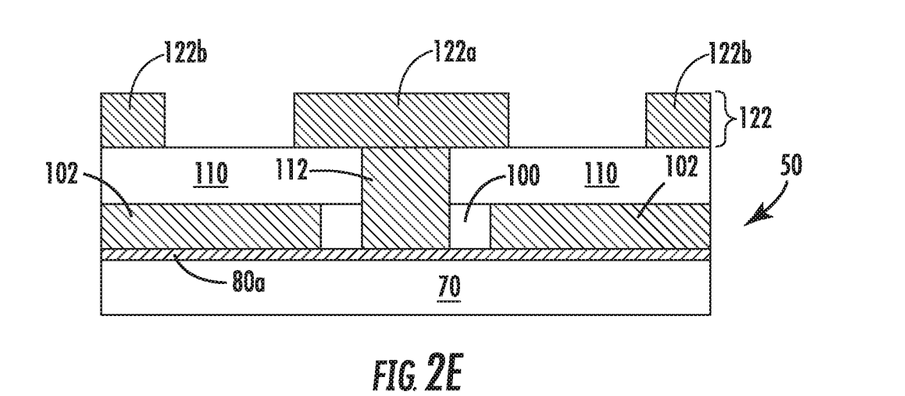

FIG. 2e illustrates metallization layer 122 formed over MOSFET cell 50. Metallization layer 122 is formed as a blanket of metal covering the wafer of substrate 52. Metallization layer 122 includes one or more layers of Al, Cu, Sn, Ni, Au, Ag, Ti, W, other suitable electrically conductive material, or a combination thereof using PVD, CVD, electrolytic plating, electroless plating process, or other suitable metal deposition process.

Metallization layer 122 is etched into metal stripes 122a over drain contacts 112 and metal stripes 122b over source contacts 114 using a photoresist and reactive ion etching or other suitable method. Metal stripes 122a are coupled to N+ drain region 70 via drain contact 112 as shown in FIG. 2e. Metal stripes 122a couple drain contacts 112 of MOSFET cell 50 to aligned drain contacts 112 of other MOSFET cells 50 as shown in FIG. 2i. Metal stripes 122b are similarly coupled to N+ source region 72 and P+ body contact 76 via source contacts 114, visible in other cross-sections. Metal stripes 122b couple source contacts 114 of MOSFET cell 50 to aligned source contacts 114 of other MOSFET cells 50 as shown in FIG. 2i. Buried metal layer 102 extends under metal stripes 122b to reduce resistance between adjacent drain contacts 112. Buried metal layer 104 similarly extends under metal stripes 122a in another cross-section to reduce resistance between adjacent source contacts 114.

Figure 2F:
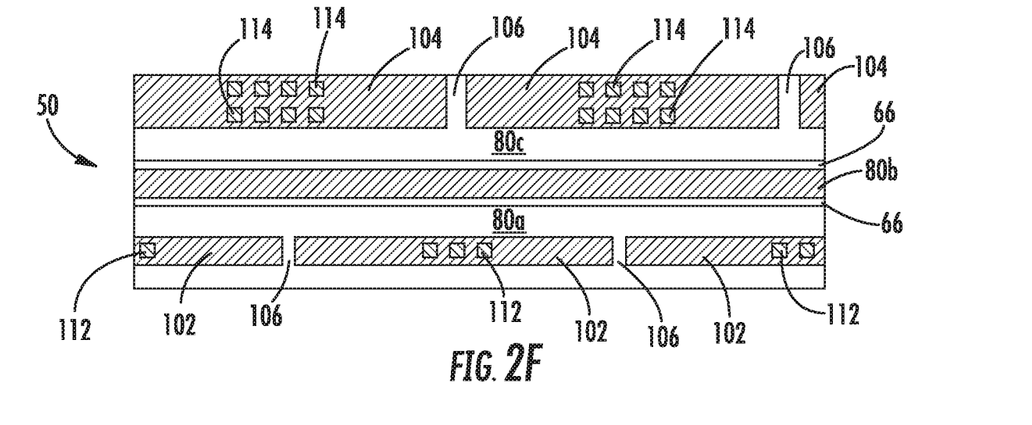
Figure 2G:
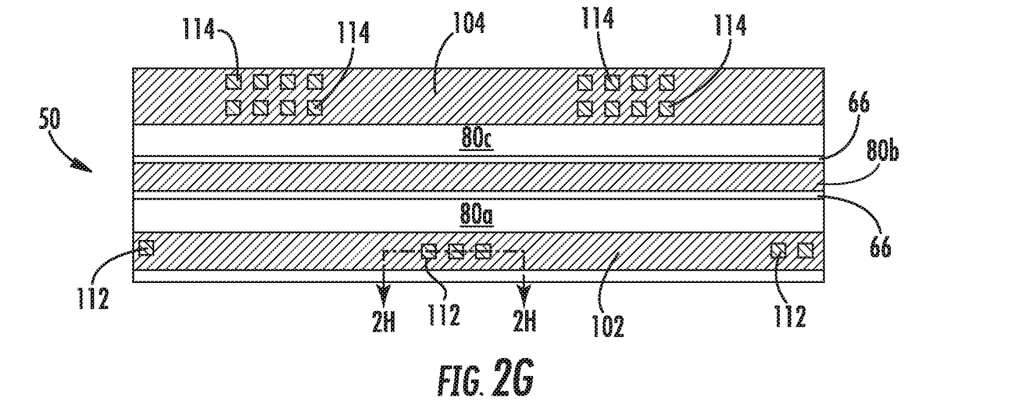
Figure 2H:
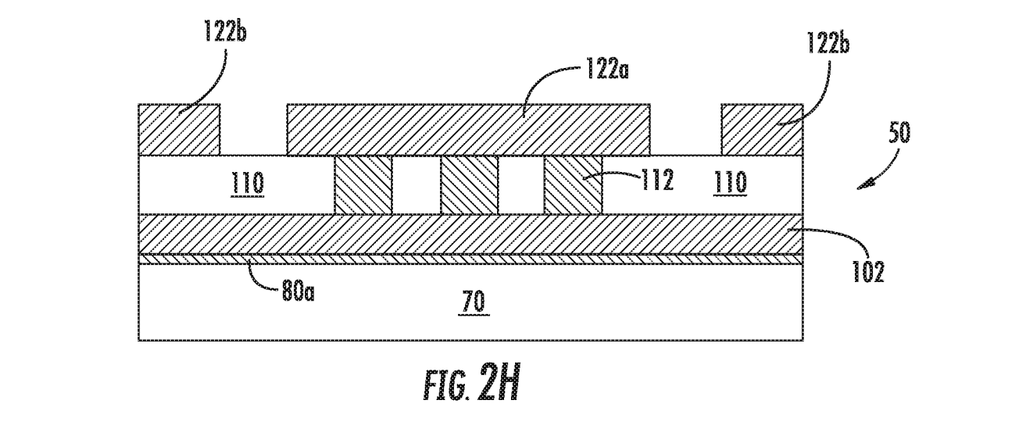
Figure 2I:
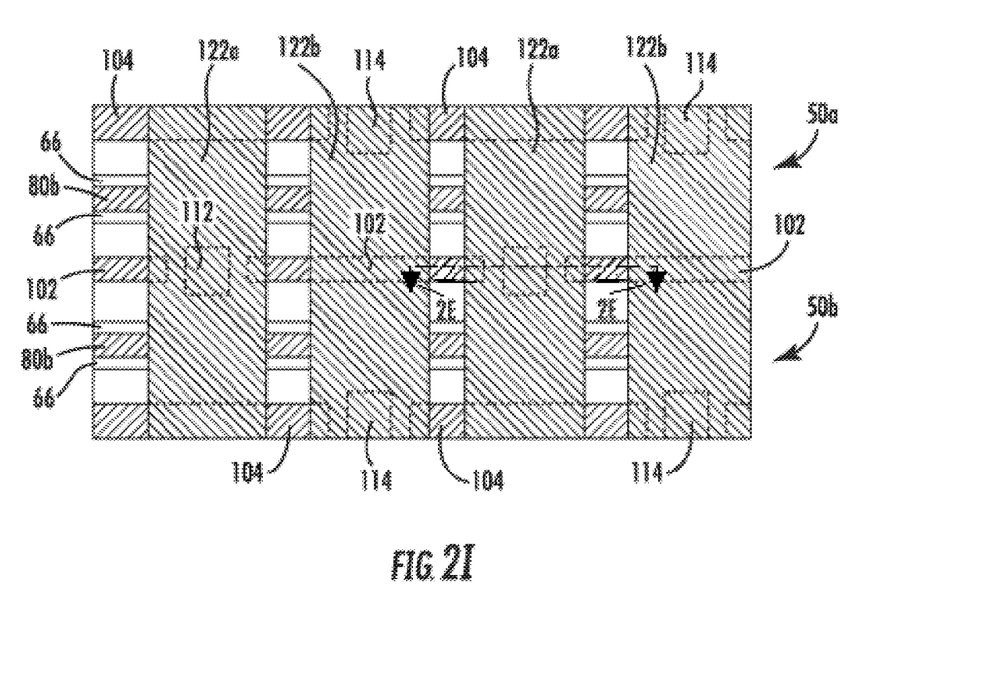

FIGS. 2f-2h illustrate an alternative embodiment, with drain contacts 112 disposed on buried metal layer 102 and source contacts 114 disposed on buried metal layer 104. Drain contacts 112 and source contacts 114 are small enough that drain contacts 112 are completely within the footprint of buried metal layer 102 and source contacts 114 are completely within the footprint of buried metal layer 104. Drain contacts 112 are grouped so that a plurality of drain contacts 112 is formed on each buried metal layer 102 under each subsequently formed metal stripe 122a. Source contacts 114 are grouped so that a plurality of source contacts 114 is formed on each buried metal layer 104 under each subsequently formed metal stripe 122b.

FIGS. 2f and 2g are views similar to FIG. 2d, but with drain contacts 112 and source contacts 114 formed on buried metal layers 102 and 104 rather than in breaks 106. The embodiment of FIG. 2f includes breaks 106 in buried metal layer 102 between adjacent locations of drain contacts 112, and in buried metal layer 104 between adjacent locations of source contacts 114. In one embodiment, breaks 106 create a space of approximately 0.2 to 0.3 μm between adjacent segments of buried metal layers 102 or 103. Breaks 106 are provided to reduce mechanical stress and wafer warpage. Breaks 106 are optional, and FIG. 2g illustrates MOSFET cell 50 without breaks 106. Buried metal layers 102 and 104 run the length of MOSFET cell 50 uninterrupted.

FIG. 2h illustrates a cross-sectional view of a portion of MOSFET cell 50 in either of FIGS. 2f and 2g. Metal stripes 122a are formed perpendicular to buried metal layers 102 and 104 at locations where drain contacts 112 are formed. Metal stripes 122b are formed perpendicular to buried metal layers 102 and 104 at locations where source contacts 114 are formed. Drain contacts 112 couple buried metal layer 102 to metal stripe 122a in FIG. 2h. Source contacts 114 couple buried metal layer 104 to metal stripes 122b in other similar cross-sectional views.

FIG. 2i illustrates a plan view of two adjacent MOSFET cells 50a and 50b. The arrows labeled 2e illustrate where the cross-section of FIG. 2e is taken. MOSFET cells 50a and 50b share a common N+ drain region 70, with common drain buried metal layers 102 and drain contacts 112 as well. Metal stripes 122a connect the drains of MOSFET cells 50a and 50b with the drains of other MOSFET cells 50 located adjacent to MOSFET cells 50a and 50b. Metal stripes 122b electrically couple the respective source contacts 114 of MOSFET cells 50a and 50b to each other, and to other aligned source contacts of adjacent MOSFET cells 50. Metal stripes 122a and 122b extend laterally across the die to couple any appropriate number of MOSFET cells 50 in parallel in various embodiments.

Buried metal layer 102 reduces electrical resistance for electrical charge in N+ drain region 70 between adjacent drain contacts 112. Buried metal layer 102 extends under metal stripes 122b without directly contacting metal stripes 122b. ILD 110 covers buried metal layer 102 and provides an insulating layer between buried metal layer 102 and metal stripes 122b. Buried metal layer 104 reduces electrical resistance for electrical charge in N+ source region 72 and P+ body contact 76 between adjacent source contacts 114.

Metal stripes 122a and 122b are formed perpendicular to gates 60 so that the width of MOSFET cells 50 can be reduced without reducing the widths of metal stripes 122a and 122b. A manufacturer using cutting-edge CMOS processing equipment can significantly reduce the size of MOSFET cells 50, while using older and less expensive equipment to form metal stripes 122a and 122b with a wider pitch. As the widths of MOSFET cells 50 are reduced, the electrical resistance increases along the doped regions of MOSFET cell 50. Buried metal layers 102 and 104 reduce electrical resistance along doped regions of MOSFET cell 50.

Figure 2J:
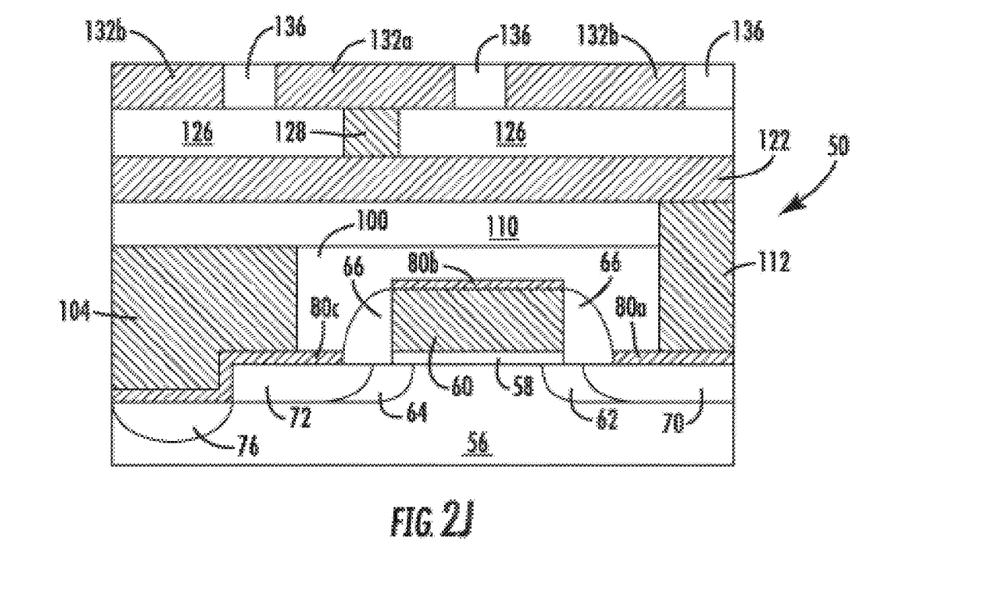

FIG. 2j illustrates inter-metal dielectric (IMD) 126 deposited over metallization layer 122. IMD 126 contains one or more layers of prepreg, photosensitive low curing temperature dielectric resist, photosensitive composite resist, LCP, laminate compound film, insulation paste with filler, solder mask resist film, liquid molding compound, granular molding compound, PI, BCB, PBO, $HfO_2$, $SiO_2$, $Si_3N_4$, SiON, $Ta_2O_5$, $Al_2O_3$, TEOS, solder resist, or other material having similar insulating and structural properties. IMD 126 is an insulating layer deposited using printing, spin coating, spray coating, lamination, or other suitable process. IMD 126 is blanket coated over the wafer of MOSFET cell 50. IMD 126 is deposited between metal stripes 122a and 122b. IMD 126 is planarized using CMP or another suitable process.

Openings are etched through IMD 126 using a photomask or LDA, and conductive vias 128 are formed in the openings through IMD 126 by depositing Al, Cu, Sn, Ni, Au, Ag, Ti, W, or other suitable electrically conductive material or combination thereof using PVD, CVD, electrolytic plating, electroless plating process, or other suitable metal deposition process. Conductive vias 128 couple metallization layer 122 to subsequently formed metallization layers.

Metallization layer 132 is formed over IMD 126. Metallization layer 132 includes metal stripes 132a and metal stripes 132b perpendicular to metal stripes 122a and 122b of metallization layer 122. Metal stripes 132a and 132b are formed similarly to metal stripes 122a and 122b. Metallization layer 132 includes one or more layers of Al, Cu, Sn, Ni, Au, Ag, Ti, W, other suitable electrically conductive material, or a combination thereof, deposited using PVD, CVD, electrolytic plating, electroless plating process, or another suitable metal deposition process. Conductive vias 128 electrically couple metal stripes 132a and 132b to metallization layer 122. A grid of conductive vias 128 couples each metal stripe 132a to each metal stripe 122a. Each metal stripe 132b is coupled to each metal stripe 122b by conductive vias 128. In some embodiments, multiple conductive vias 128 are used at each intersection of a metal stripe 122a with a metal stripe 132a, and each intersection of a metal stripe 122b with a metal stripe 132b, similar to how groups of drain contacts 112 and source contacts 114 are used in FIGS. 2f-2h.

Insulating layer 136 is formed over and between metal stripes 132a and 132b. Insulating layer 136 contains one or more layers of prepreg, photosensitive low curing temperature dielectric resist, photosensitive composite resist, LCP, laminate compound film, insulation paste with filler, solder mask resist film, liquid molding compound, granular molding compound, PI, BCB, PBO, $HfO_2$, $SiO_2$, $Si_3N_4$, SiON, $Ta_2O_5$, $Al_2O_3$, TEOS, solder resist, or other material having similar insulating and structural properties. Insulating layer 136 is deposited using printing, spin coating, spray coating, lamination, or other suitable process.

Figure 3:
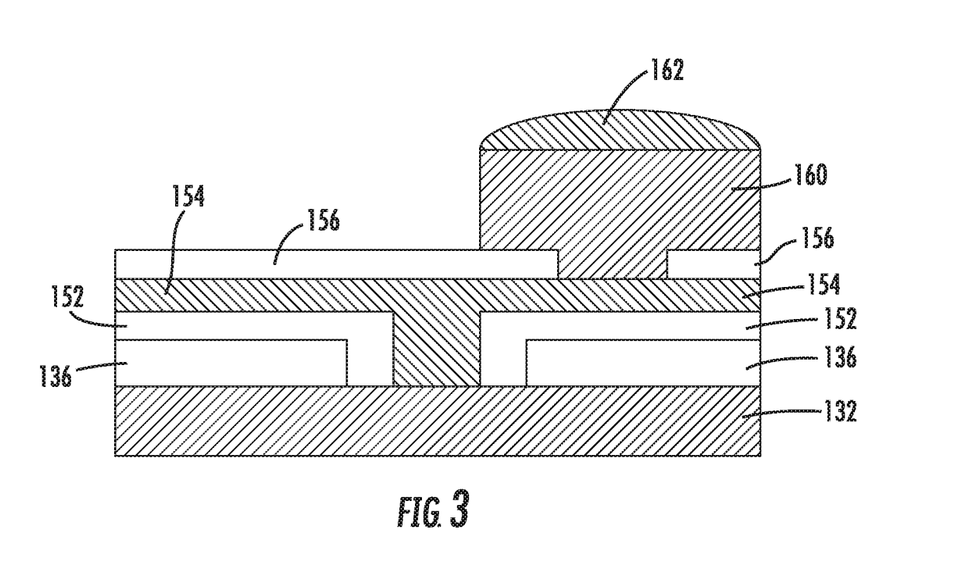
FIG. 3 illustrates RDL layers and conductive pillars formed over the MOSFET metal layers of FIG. 2j.

In one embodiment, insulating layer 136 and metallization layer 132 are planarized using CMP or another suitable process so that top surfaces of insulating layer 136 and metallization layer 132 are coplanar. In other embodiments, as illustrated in FIG. 3, a portion of insulating layer 136 remains over metallization layer 132 and openings are later etched through insulating layer 136 to expose metallization layer 132 for electrical contact. Any appropriate number of metallization layers are formed over MOSFET cell 50 in addition to metallization layers 122 and 132 as desired for specific requirements of an embodiment. While metallization layers 122 and 132 include stripes formed perpendicular relative to an immediately underlying layer, other appropriate shapes of metallization layers are used in other embodiments.

FIG. 3 illustrates a redistribution layer (RDL) formed over metallization layer 132 of FIG. 2j. Insulating layer 152 is deposited over metallization layer 132 and insulating layer 136. Insulating layer 152 contains one or more layers of prepreg, photosensitive low curing temperature dielectric resist, photosensitive composite resist, LCP, laminate compound film, insulation paste with filler, solder mask resist film, liquid molding compound, granular molding compound, PI, BCB, PBO, $HfO_2$, $SiO_2$, $Si_3N_4$, SiON, $Ta_2O_5$, $Al_2O_3$, solder resist, or other material having similar insulating and structural properties. In one embodiment, insulating layer 152 is a Spheron™ dielectric layer. Insulating layer 152 is deposited using printing, spin coating, spray coating, lamination, or other suitable process.

Openings are formed through insulating layer 152 extending to metallization layer 132. In embodiments where insulating layer 136 is over metallization layer 132, the openings formed through insulating layer 152 extend through the previously formed openings of insulating layer 136. In some embodiments, no opening was previously formed in insulating layer 136, and an opening is formed through both insulating layers 136 and 152 in a single process step after depositing insulating layer 152.

Conductive layer 154 is formed over insulating layer 152 and extends into the opening through insulating layer 152 to electrically contact metallization layer 132. Conductive layer 154 includes one or more layers of Al, Cu, Sn, Ni, Au, Ag, Ti, W, other suitable electrically conductive material, or a combination thereof, deposited using PVD, CVD, electrolytic plating, electroless plating process, or another suitable metal deposition process. In some embodiments, a seed layer of Ti, TiN, or other suitable conductive material is deposited over insulating layer 152 and metallization layer 132 prior to formation of conductive layer 154. Conductive layer 154 is formed using a photomask in one embodiment. The photomask is removed after formation of conductive layer 154.

Conductive layer 154 forms a parallel path for electric current in metal stripes 132a and 132b, reducing the sheet resistance of metallization layer 132. Conductive layer 154 is patterned to have significant contact area between conductive layer 154 and metal stripes 132a and 132b. Increased contact area between the conductive layers results in reduced electrical resistance.

Insulating layer 156 is formed over conductive layer 154 and insulating layer 152. Insulating layer 156 contains one or more layers of prepreg, photosensitive low curing temperature dielectric resist, photosensitive composite resist, LCP, laminate compound film, insulation paste with filler, solder mask resist film, liquid molding compound, granular molding compound, PI, BCB, PBO, HfO2, SiO2, Si3N4, SiON, Ta2O5, Al2O3, solder resist, or other material having similar insulating and structural properties. In one embodiment, insulating layer 156 is a Spheron™ dielectric layer. Insulating layer 156 is deposited using printing, spin coating, spray coating, lamination, or other suitable process. Insulating layer 156 is patterned to expose portions of conductive layer 154.

Conductive pillar 160 is formed over conductive layer 154 in openings of insulating layer 156. Conductive pillar 160 is electrically coupled to conductive layer 154. Conductive pillar 160 includes one or more layers of Al, Cu, Sn, Ni, Au, Ag, Ti, W, other suitable electrically conductive material, or a combination thereof, deposited using PVD, CVD, electrolytic plating, electroless plating process, or another suitable metal deposition process. In some embodiments, a seed layer of Ti, TiN, or other suitable conductive material is deposited over insulating layer 156 and conductive layer 154 prior to formation of conductive pillar 160. Conductive pillar 160 is formed using a photomask in one embodiment.

Solder cap 162 is deposited over conductive pillar 160. In one embodiment, solder cap 162 is a solder paste printed onto conductive pillar 160 using the mask that was used to form conductive pillar 160. In other embodiments, solder cap 162 contains Sn, lead-free alloy, Sn—Ag alloy, Sn—Ag—Cu alloy, Sn—Ag-indium (In) alloy, eutectic solder, tin alloys with Ag, Cu, or Pb, or other similar materials. In one embodiment, a height of conductive pillar 160 over insulating layer 156 is approximately 65 µm, and a height of solder cap 162 over the conductive pillar is approximately 35 µm. Conductive pillars 160 include a circular, rectangular, oval, or oblong footprint in various embodiments. In one embodiment, conductive pillars 160 are oblong with a length of approximately 0.27 mm and a width of approximately 0.1 mm. Each conductive pillar 160 is spaced apart from adjacent conductive pillars by approximately between 0.2 mm and 0.5 mm.

Figure 4:
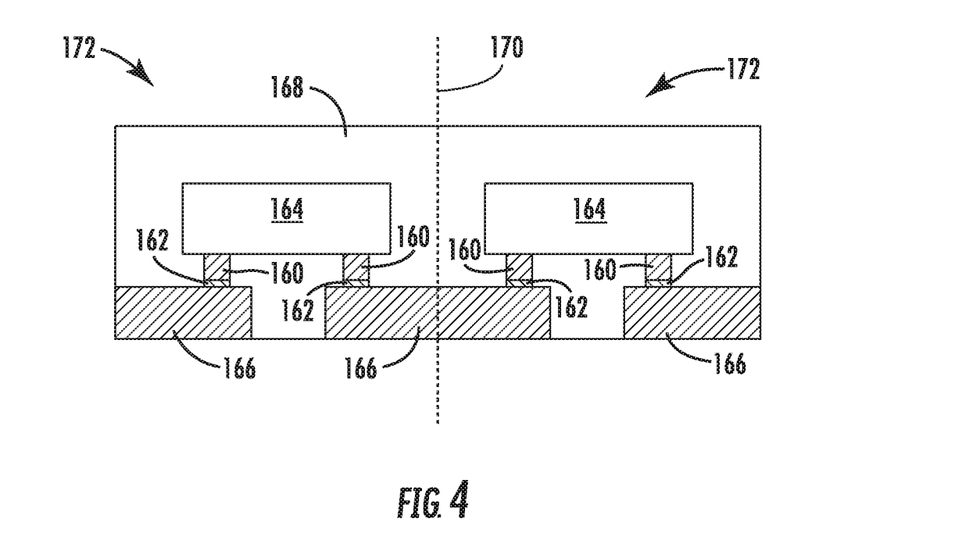
FIG. 4 illustrates MOSFET devices mounted on a leadframe and encapsulated.

FIG. 4 shows MOSFET devices 164 with conductive pillars 160 and solder caps 162 disposed over leadframe 166. Each MOSFET device 164 includes a plurality of MOSFET cells 50 coupled in parallel by metallization layers 122 and 132. MOSFET devices 164 include a conductive pillar 160 for each MOSFET terminal that can be connected to externally. In some embodiments, each of the conduction terminals, i.e., source and drain, of MOSFET devices 164 include a plurality of conductive pillars 160 to further reduce resistance for electric current. In one embodiment, solder paste is printed on leadframe 166 prior to disposing MOSFET devices 164 on leadframe 166. MOSFET devices 164 are flip-chipped onto leadframe 166 and the solder paste on leadframe 166 is reflowed together with solder cap 162 to attach MOSFET devices 164 to leadframe 166.

In one embodiment, leadframe 166 includes a lead for each conductive pillar 160. In other embodiments, a plurality of conductive pillars 160 for a single terminal is connected by a common lead of leadframe 166. Leadframe 166 creates a form-factor for MOSFET devices 164 that conforms to standards commonly used in mounting semiconductor devices to printed circuit boards (PCBs) and other substrates. Leadframe 166 has a thickness of about eight mils, i.e., 8/1000 inches, in one embodiment. Leadframe 166 is formed from one or more layers of Al, Cu, Sn, Ni, Au, Ag, Ti, W, other suitable electrically conductive material, or a combination thereof.

After MOSFET devices 164 are attached to leadframe 166 by reflowing solder caps 162, encapsulant 168 is deposited over and around leadframe 166 and MOSFET devices 164 using a paste printing, compressive molding, transfer molding, liquid encapsulant molding, vacuum lamination, spin coating, or other suitable applicator. Encapsulant 168 includes polymer composite material, such as epoxy resin with filler, epoxy acrylate with filler, or polymer with proper filler. Encapsulant 168 is non-conductive and environmentally protects MOSFET devices 164 from external elements and contaminants. Encapsulant 168 is cured, cleaned, and deflashed as desired.

In some embodiments, exposed surfaces of leadframe 166 are plated with an additional conductive layer, e.g., Sn, after applying encapsulant 168 to promote wetting of solder on leadframe 166. MOSFET devices 164 are singulated through saw streets 170 using a saw blade or laser cutting device to singulate individual MOSFET packages 172. MOSFET packages 172 are checked for quality and shipped to customers in a standard tape and reel.

Packaging MOSFET devices 164 using the flip-chip on leadframe (FCOL) technology shown in FIG. 4 provides a cost savings over wirebonding. Leadframe 166 functions as an interposer to translate the location and sizes of conductive pillars 160 to a terminal layout on the bottom of MOSFET packages 172. The terminal layout of MOSFET packages 172 is designed to simplify PCB design and assembly, increasing yield and reducing cost of equipment, manufacturing, and assembly. MOSFET devices 164 can be mounted directly to a PCB or other substrate using conductive pillars 160 and solder caps 162. MOSFET devices 164 can also be packaged into MOSFET packages 172 and mounted to a substrate via leadframe 166.

MOSFET devices 164 are discrete lateral power MOSFET devices made with industry standard CMOS process technologies, include buried metal layers 102 and 104 to reduce silicide resistance, include conductive pillars 160 for interconnection, and are packaged using FCOL technology. Using standard CMOS process technologies reduces manufacturing cost. Buried metal layers 102 and 104 reduce resistance along the doped regions of MOSFET cells 50 within MOSFET devices 164. Using conductive layer 154 and conductive pillars 160 reduces metal layer resistance and eases scaling limitations of large-scale power MOSFETs. MOSFET devices 164 provide a discrete lateral MOSFET with increased current handling capabilities due to reduced on-resistance. In some embodiments, buried metal layers 102 and 104 are used without copper pillars 160 of FIG. 3 and the FCOL packaging of FIG. 4.

Figure 5:
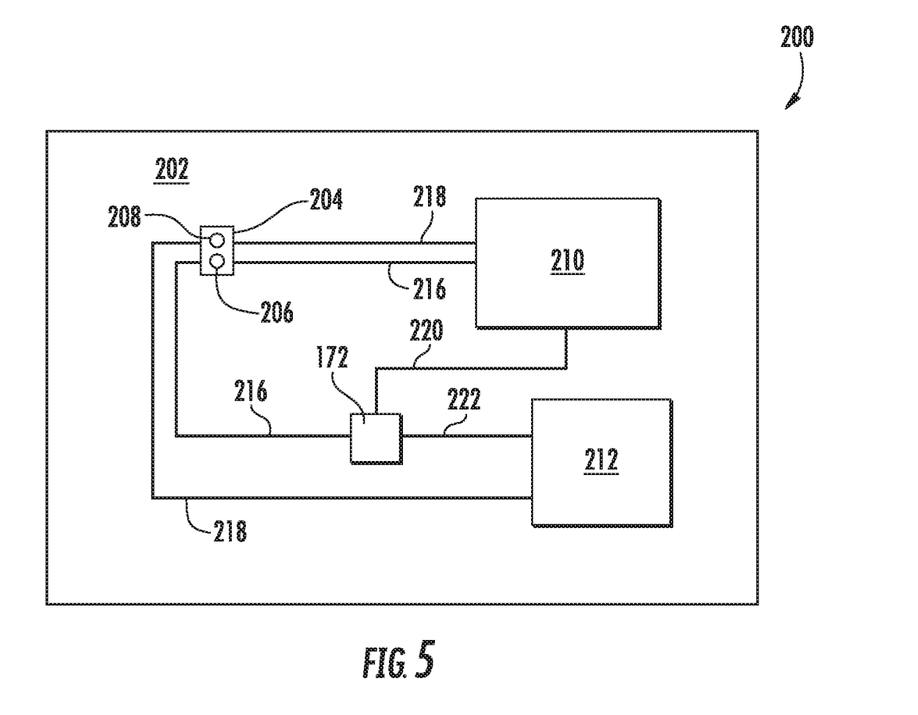
FIG. 5 illustrates a system incorporating a MOSFET device.

FIG. 5 illustrates an electronic device 200 including a MOSFET package 172 in use. PCB 202 is provided as a substrate. Power receptacle 204 is mounted on PCB 202, and includes voltage contact 204 and ground contact 206. Central Processing Unit (CPU) 210 and semiconductor package 212 are also mounted on PCB 200.

CPU 210 is connected to, and receives a power signal from, power receptacle 204 via voltage supply trace 216. Voltage supply trace 216 is in contact with voltage contact 206. CPU 210 is couple to ground contact 208 via ground trace 218. CPU 210 is powered by electric current from power receptacle 204. In practice, a power plug is connected to power receptacle 204 to power electronic device 200. Power receptacle 204 is illustrated as a power plug, but electronic device 200 receives power from other types of electric contacts in other embodiments.

CPU 210 includes a control signal output connected to control signal trace 220. Control signal trace 220 is routed to the gate terminal of MOSFET device 172 to control current flow between the drain terminal and source terminal of MOSFET device 172. MOSFET device 172 is also coupled to voltage supply trace 216 at a drain terminal of MOSFET device 172, and is coupled to semiconductor package 212 via switched voltage trace 222. CPU 210 controls the coupling of semiconductor package 212 to voltage supply trace 216 by toggling a signal output to control signal trace 220. A voltage at control signal trace 220 is connected to the gate of MOSFET device 172 and opens or closes a carrier channel in MOSFET device 172. When the electrical path from voltage supply trace 216 to switched voltage supply trace 220 through MOSFET device 172 is open, power flows to semiconductor package 212 and turns on the circuits and components of semiconductor package 212.

Semiconductor package 212 represents any device that can be electrically switched. Semiconductor package 212 is a display element, sensor array, supplemental processor, or other semiconductor device in various embodiments. In one embodiment, semiconductor package 212 and MOSFET device 172 together form a switch-mode power supply. The functionality provided by semiconductor package 212 is turned off by CPU 210 via control signal trace 220 when not needed to reduce power consumption. In other embodiments, CPU 210 rapidly switches MOSFET device 172 to provide a pulse-width modulated power signal at switched voltage supply trace 220.

Terms of relative position as used in this description are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A semiconductor device, comprising:
   a semiconductor substrate including a doped region of one of a source and a drain of the semiconductor device;
   a silicide layer formed on the doped region;
   a metal layer formed on the silicide layer, wherein the metal layer and the doped region each have a length extending in a first direction taken along a surface of the semiconductor substrate;
   an insulating layer formed over the metal layer;
   an electric contact formed through the insulating layer; and
   a metal stripe formed over the insulating layer and having a length extending in a second direction taken along the surface of the semiconductor substrate that is perpendicular to the first direction of the metal layer and the doped region, the electric contact physically extending between the metal stripe and the silicide layer, and providing electrical connection between the metal stripe and the doped region of the one of the source and drain of the semiconductor device.

2. The semiconductor device of claim 1, further including a conductive pillar formed over the semiconductor substrate and electrically coupled to the doped region through the electric contact.

3. The semiconductor device of claim 1, further including a break formed in the metal layer.

4. The semiconductor device of claim 3, wherein the electric contact is formed in the break of the metal layer.

5. The semiconductor device of claim 1, wherein the electric contact is formed at an intersection region at which a portion of the metal stripe overlies the doped region.

6. The semiconductor device of claim 5, wherein the electric contact is one of a plurality of electric contacts formed at the intersection region.

7. The semiconductor device of claim 1, wherein the insulating layer covers the metal layer.

8. The semiconductor device of claim 1, further comprising first and second breaks in the metal layer that define a segment portion of the metal layer in the first direction.

9. The semiconductor device of claim 8, wherein the electric contact provides connection to the doped region in one of the first and second breaks.

10. The semiconductor device of claim 8, wherein the metal layer comprises a buried metal layer.

11. The semiconductor device of claim 8, further comprising a gate that has a length extending in the first direction in parallel with the length of each of the doped region and the metal layer without any breaks such that the length of the gate extends beyond the first and second breaks in parallel with the length of the metal layer.

12. The semiconductor device of claim 1, wherein the doped region is included in a first MOSFET cell and a second adjacent MOSFET cell adjacent to the first MOSFET cell, and wherein the metal stripe is configured to provide electrical connection between the first MOSFET cell and the second adjacent MOSFET cell.

13. The semiconductor device of claim 12, wherein the doped region is commonly included in the first MOSFET cell and the second MOSFET cell.

14. A semiconductor device, comprising:
   a semiconductor substrate including a doped region of the semiconductor device, wherein the doped region has a length extending in a first direction taken along a surface of the semiconductor substrate;
   a silicide layer formed on the doped region of the semiconductor device;
   a metal layer formed on the silicide layer;
   an insulating layer covering the metal layer;
   an electric contact extending through the insulating layer;
   a metal stripe formed over the electric contact and having a length extending in the first direction taken with respect to the surface of the semiconductor substrate that is parallel to the metal layer, the electric contact physically extending between the metal stripe and the silicide layer, and providing electrical connection between the metal stripe and the doped region of the semiconductor device.

15. The semiconductor device of claim 14, wherein the metal layer is a stripe that also has a length extending extends in the first direction parallel to the doped region of the semiconductor device.

16. The semiconductor device of claim 15, further including a break formed in the metal layer.

* * * * *